(12) United States Patent
Kwag

(10) Patent No.: US 10,999,960 B2
(45) Date of Patent: May 4, 2021

(54) ELECTROMAGNETIC WAVE SHIELDING MATERIAL USING PERFORATED METAL THIN PLATE AND METHOD OF MANUFACTURING SAME

(71) Applicant: CLEAN & SCIENCE CO., LTD., Seoul (KR)

(72) Inventor: Gyu Beom Kwag, Seoul (KR)

(73) Assignee: CLEAN & SCIENCE CO., LTD., Seoul (KR)

( * ) Notice: Subject to any disclaimer, the term of this patent is extended or adjusted under 35 U.S.C. 154(b) by 0 days.

(21) Appl. No.: 16/468,257

(22) PCT Filed: Aug. 16, 2018

(86) PCT No.: PCT/KR2018/009367
§ 371 (c)(1),
(2) Date: Jun. 10, 2019

(87) PCT Pub. No.: WO2019/083141
PCT Pub. Date: May 2, 2019

(65) Prior Publication Data
US 2020/0100405 A1  Mar. 26, 2020

(30) Foreign Application Priority Data
Oct. 25, 2017  (KR) .......................... 10-2017-0139121

(51) Int. Cl.
*H05K 9/00* (2006.01)
(52) U.S. Cl.
CPC ........... *H05K 9/0084* (2013.01); *H05K 9/009* (2013.01); *H05K 9/0086* (2013.01)
(58) Field of Classification Search
CPC .................................................. H05K 9/0086
See application file for complete search history.

(56) References Cited

U.S. PATENT DOCUMENTS 4,678,699 A * 7/1987 Kritchevsky ......... B29C 51/145
174/393
8,114,512 B2 * 2/2012 Kojima ................ H05K 9/0096
428/328

(Continued)

FOREIGN PATENT DOCUMENTS

JP  08-025493 A  1/1996
JP  2012-109452 A  6/2012
(Continued)

OTHER PUBLICATIONS

Korean Office Action dated Jul. 20, 2018 for corresponding Korean Application No. 102017-0139121 (4 pages).
(Continued)

*Primary Examiner* — Hung V Ngo
(74) *Attorney, Agent, or Firm* — Lewis Roca Rothgerber Christie LLP

(57) ABSTRACT

A method of manufacturing an electromagnetic wave shielding material using a perforated metal thin plate, the method including: forming a gel coat to a mold; forming a first metal layer on a first composite layer by arranging a perforated metal thin plate, after forming the first composite layer on the gel coat layer formed in the first step; forming a second metal layer by arranging a perforated metal thin plate and the first metal layer formed in the second step in such a way that positions of perforations are arranged in a staggered manner without overlapping, after forming a second composite layer on the first metal layer formed in the second step; and molding the electromagnetic wave shielding material by curing and demolding after forming a third composite material on the second metal layer formed in the third step.

7 Claims, 1 Drawing Sheet

(56) References Cited

U.S. PATENT DOCUMENTS

| | | | |
|---|---|---|---|
| 8,203,083 B2* | 6/2012 | Song | H05K 9/0086 |
| | | | 174/354 |
| 9,144,185 B1* | 9/2015 | Hansen | H05K 9/0081 |
| 10,399,253 B2* | 9/2019 | Xie | B29C 70/54 |
| 2010/0214713 A1* | 8/2010 | Song | B32B 3/26 |
| | | | 361/220 |
| 2016/0044839 A1* | 2/2016 | Akahane | H05K 9/0086 |
| | | | 442/1 |
| 2018/0162098 A1* | 6/2018 | Joo | D03D 1/0058 |
| 2018/0177083 A1 | 6/2018 | Kammuri et al. | |

FOREIGN PATENT DOCUMENTS

| | | |
|---|---|---|
| JP | 2017-005214 A | 1/2017 |
| KR | 10-2016-0136226 | 11/2016 |
| WO | WO 2015/105340 A1 | 7/2015 |

OTHER PUBLICATIONS

International Search Report dated Nov. 23, 2018 for corresponding International Application No. PCT/KR2018/009367 (3 pages).

\* cited by examiner

ELECTROMAGNETIC WAVE SHIELDING MATERIAL USING PERFORATED METAL THIN PLATE AND METHOD OF MANUFACTURING SAME

CROSS-REFERENCE TO RELATED APPLICATION(S)

This application is a U.S. National Phase Patent Application of International Application Number PCT/KR2018/009367, filed on Aug. 16, 2018, which claims priority of Korean Patent Application Number 10-2017-0139121, filed on Oct. 25, 2017, the entire contents of all of which are incorporated herein by reference.

TECHNICAL FIELD

The present invention relates to an electromagnetic wave shielding material using a perforated metal thin plate and a method of manufacturing the same. More particularly, the present invention relates to an electromagnetic wave shielding material that is manufactured at high efficiency and low cost with high strength and lightweight, and to a method of manufacturing the same. The electromagnetic wave shielding material according to the present invention is formed by integrating a perforated metal thin plate and a composite layer, which is formed by impregnating and defoaming reinforced fiber by a liquid thermosetting resin.

BACKGROUND ART

Recently, due to developments according to characteristics such as convenience, high-quality, lightweight, slimness, and hybridization, a large number of electronic components have been adopted for various electronic devices installed in airplanes, automobiles, and ships. However, since a large amount of harmful electromagnetic waves is emitted from these devices, malfunction of various electronic devices and occurrence of safety accidents are emerging as social issues. In order to block electromagnetic waves, composite materials having new functionality that block electromagnetic waves by adding materials such as carbon, metal, ceramic, and the like to lightweight polymer composite materials are being studied.

As a conventional technique related to this, Korean Patent No. 10-0943721 (Feb. 26, 2010) relates to a concrete member of a new structure which may be manufactured inexpensively and easily while exhibiting excellent electromagnetic wave shielding performance, wherein a metal thin plate such as an aluminum thin plate or the like is disposed in a state, which the metal thin plate is laminated to a concrete member. However, a subject of the electromagnetic wave shielding for the above-described technology is a concrete member, which is different from an electronic device, which is a subject for the present invention. Therefore, the above-described technology has a problem of being incapable of being applied to the electronic device.

Disclosed in Korean Patent No. 10-0460297 (Nov. 26, 2004) is an electromagnetic wave shielding material using a metal foil ribbon having a high specific permeability. The metal foil ribbon having a high specific permeability includes a metal foil ribbon having a thickness of 1-900 μm, and a width 1-90 mm and further includes an adhesive layer formed on at least one surface of the metal foil ribbon, wherein the metal foil ribbon is metal or an alloy having a specific permeability of 1,000 or more.

In addition, in Korean Patent No. 10-0376960 (Mar. 8, 2003), a method of forming a functional film for electromagnetic wave shielding on a plastic substrate is disclosed. After forming a multilayer plating film on the surface of the plastic substrate, a multilayer film composed of a single film of each material or a combination of these single films is formed on the multilayer plating film by vapor deposition using a sputtering target made of at least one selected from nickel, chromium, and alloy of nickel and chromium, through a magnetron sputtering method, to improve the adhesion between a gold (Au) film, which will be formed lastly for shielding electromagnetic wave, and the plating film.

Further, in Korean Patent No. 10-0707382 (Apr. 6, 2007), a manufacturing technique of an electromagnetic wave absorber for manufacturing a flexible electromagnetic wave absorber is disclosed. First, a blending ratio of an electromagnetic wave absorption blocking material composition composed of a ferrite powder, which is an oxide magnetic material, in comparison with a blending ratio of a synthetic resin composition, with respect to the total composition of the electromagnetic wave absorber is 80 to 90 w % or more to constitute a liquid electromagnetic wave absorber. The liquid electromagnetic wave absorber is coated on the surface of a thin heat-resistant film to have a thickness of about zero. 01-0.5 mm by using an application roller, and then cured by passing through a drying oven prior to removing the heat-resistant film, whereby a flexible electromagnetic wave absorber having a thin film shape is manufactured.

However, since the electromagnetic wave shielding material of the conventional art as described above is difficult not only to manufacture with a lightweight of a super thin film type but also to attain the same efficiency of electromagnetic wave absorption and shielding as expected. Accordingly, it has a problem limiting wide use in various electronic and communication devices that become light, thin, short, and small and are integrated.

Therefore, there is an urgent need to develop technology for electromagnetic wave shielding materials to solve these problems.

DISCLOSURE

Technical Problem

The present invention has been made to solve the above-mentioned problems and difficulties and relates to an electromagnetic wave shielding material using a perforated metal plate and a method of manufacturing the same, wherein the electromagnetic wave shielding material is manufactured at high efficiency and low cost with high strength and lightweight. Here, the electromagnetic wave shielding material is formed by integrating a perforated metal thin plate and a composite layer, which is formed by impregnating and defoaming reinforced fiber by a liquid thermosetting resin.

Technical Solution

In order to accomplish the above object, the present invention provides a method of manufacturing an electromagnetic wave shielding material using a perforated metal thin plate, the method including: 1) a first step of forming a gel coat to a mold; 2) a second step of forming a first metal layer on a first composite layer by arranging a perforated metal thin plate, after forming the first composite layer on the gel coat layer formed in the first step by impregnating and defoaming firstly a reinforced fiber by the thermosetting resin; 3) a third step of forming a second metal layer by arranging a perforated metal thin plate and the first metal layer formed in the second step in such a way that positions of perforations are arranged in a staggered manner without overlapping, after forming a second composite layer on the first metal layer formed in the second step by impregnating and defoaming secondly a reinforced fiber by the thermosetting resin; and 4) a fourth step of molding the electromagnetic wave shielding material by curing and demolding after forming a third composite material on the second metal layer formed in the third step by impregnating and defoaming again thirdly the reinforced fibers by the thermosetting resin, wherein the electromagnetic wave shielding material molded by continuously performing the processes of the first through fourth steps is integrated into a single body by chemical bonding between respective constituent layers.

In addition, the present invention provides an electromagnetic wave shielding material using a perforated metal thin plate, which is manufactured by the method of manufacturing the electromagnetic wave shielding material.

Meanwhile, means for solving the other specific problems according to the present invention is described in the detailed description of the invention.

Advantageous Effects

According to the electromagnetic wave shielding material using the perforated metal thin plate and the method of manufacturing the same of the present invention, by integrating a perforated metal thin plate and a composite layer, which is formed by impregnating and defoaming reinforced fiber by a liquid thermosetting resin and by also arranging positions of perforations in a staggered manner without overlapping, the electromagnetic wave shielding material is manufactured at high efficiency and low cost with high strength and high strength and lightweight.

Further, there is an advantage that the shielding material of the present invention may be utilized as a new material capable of overcoming the limitation of high price and low moldability, which is a problem of conventional electromagnetic wave shielding material currently utilizing graphene, carbon nanotube, carbon fiber, or the like.

BEST MODE

Figure 1:
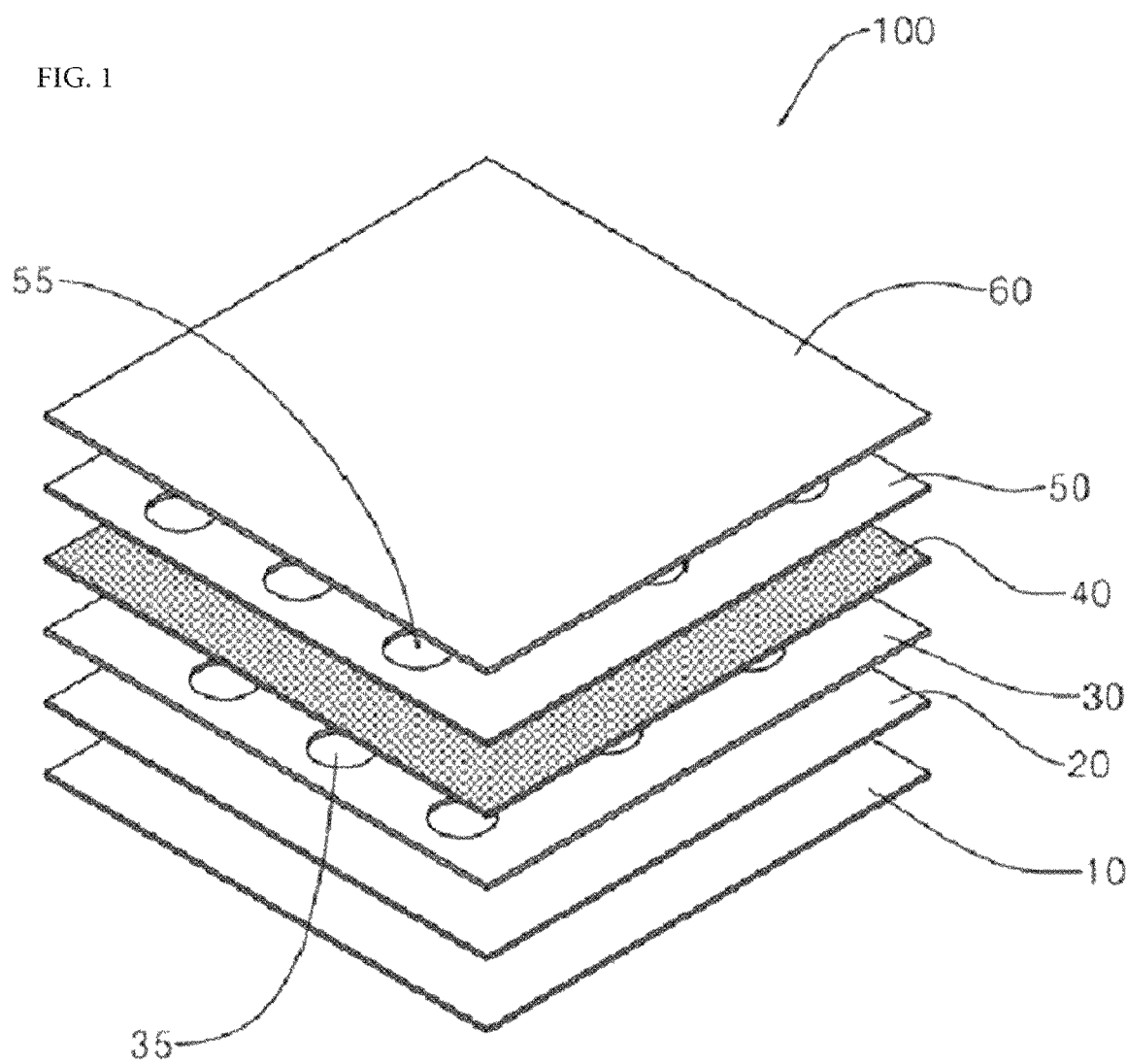
FIG. 1 is a schematic view of an electromagnetic wave shielding material illustrating an electromagnetic wave shielding material using a perforated metal thin plate and a method of manufacturing the same of the present invention.

Hereinafter, embodiments of the present invention will be described in detail with reference to the accompanying drawings. The embodiments of the present invention may be modified in various forms and the scope of the present invention should not be construed as being limited to the following embodiments. The embodiments of the present invention are provided for a complete description for those skilled in the art. Accordingly, the shape and detailed configuration of the elements in the drawings have been simplified for the sake of explanation, and it should be noted that the terms used herein are terms used to properly represent preferred embodiments of the present invention.

Hereinafter, with respect to an electromagnetic wave shielding material using a perforated metal thin plate, wherein the perforated metal thin plate may be used for the electromagnetic wave shielding material and is capable of shielding the electromagnetic wave of the present embodiment, detailed specifications along with manufacturing method and structure thereof will be described in detail. The electromagnetic wave shielding material using the perforated metal thin plate of the present invention and the manufacturing method thereof are not limited thereto and may be used without limitation in various devices and equipment requiring electromagnetic wave shielding.

Figure 2:
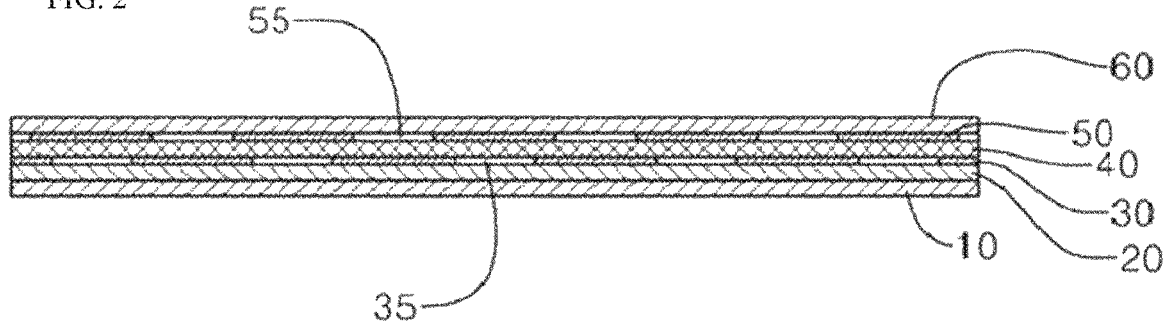
FIG. 2 is a schematic cross-sectional view of an electromagnetic wave shielding material illustrating an electromagnetic wave shielding material using a perforated metal thin plate and a method of manufacturing the same of the present invention.

Illustrated in FIGS. 1 and 2 are schematic views illustrating the electromagnetic wave shielding material using the perforated metal thin plate and the method of manufacturing the same of the present invention.

The method of manufacturing the electromagnetic wave shielding material using the thin metal plate according to the present invention includes: 1) a first step of forming a gel coat layer 10 by applying a gel coat to a mold; 2) a second step of forming a first metal layer 30 on a first composite layer by arranging a perforated metal thin plate, after forming the first composite layer 20 on the gel coat layer 10 formed in the first step by impregnating and defoaming firstly a reinforced fiber by the thermosetting resin; 3) a third step of forming a second metal layer 50 by arranging a perforated metal thin plate and the first metal layer 30 formed in the second step in such a way that positions of perforations 35 and 55 are arranged in a staggered manner without overlapping, after forming a second composite layer 40 on the first metal layer 30 formed in the second step by impregnating and defoaming secondly a reinforced fiber by the thermosetting resin; and 4) a fourth step of molding the electromagnetic wave shielding material by curing and demolding after forming a third composite material 60 on the second metal layer 50 formed in the third step by impregnating and defoaming again thirdly the reinforced fibers by the thermosetting resin, wherein the electromagnetic wave shielding material molded by continuously performing the processes of the first through fourth steps is integrated into a single body by chemical bonding between respective constituent layers.

First, the first step, as a step of preparing the electromagnetic wave shielding material using the thin metal plate according to the present invention, is configured to form the gel coat layer 10 by applying the gel coat to the mold. More specifically, according to various forms of the shielding material, after the surface condition of the mold treated with the release agent is confirmed, the shielding material is straightened with the mold surface by a spray gun or a brush. This is to protect the surface of the gel coat layer 10 by uniformly coating the surface of the mold, and a gel coat made of an unsaturated polyester or vinyl ester resin is applied several times to form the gel coat layer 10 having preferably a thickness of 0.3-0.5 mm. At this time, when the thickness is less than 0.3 mm, a glass pattern occurs, thereby causing appearance problems. When the thickness is more than 0.5 mm, cracks and peeling of the surface may occur.

The second step is configured to form a first metal layer 30 by arranging a perforated metal thin plate, after forming the first composite layer 20 on the gel coat layer 10 formed in the first step by impregnating and defoaming firstly the reinforced fiber by the thermosetting resin. As the reinforced fiber having a quality of the material of glass fiber, carbon fiber, or basalt fiber, which may be used in this case, a chopped mat, yarn cloth, roving cloth, a continuous mat, nonwoven fabrics and the like may be listed. In addition, as examples of the thermosetting resin for impregnating the reinforced fiber, unsaturated polyester resin, vinyl ester resin, epoxy resin, phenol resin, and the like may be listed. Meanwhile, the perforated metal thin plate is aluminum or copper, and it is preferable to use a thin plate having a thickness of 0.01-0.5 mm. When the thickness is less than 0.01 mm, the strength is weak, and a tearing problem may occur during use. When the thickness is more than 0.5 mm, the workability is deteriorated, and difficulty in laminating may occur, which is disadvantageous. In addition, process of impregnation and defoaming may simultaneously impregnate and defoam the reinforced fiber using the impregnating roller. In this way, the gel coat layer 10 and the thin plate may be firmly laminated by defoaming fine bubbles or voids existing therebetween.

The third step is configured to form a second metal layer 50 on a second composite material layer 40 by arranging a perforated metal thin plate and the first metal layer 30 formed in the second step in such a way that positions of perforations are arranged in a staggered manner without overlapping, after forming the second composite layer 40 on the first metal layer 30 formed in the second step by impregnating and defoaming secondly a reinforced fiber by the thermosetting resin. The reinforced fiber or thermosetting resin used herein may be the same as that used in the second step, and the process of impregnation and defoaming may be performed in the same way as in the second step. In addition, the reason why the perforations 35 of the first metal layer 30 formed in the second step and the perforations 55 of the metal thin plate are arranged in a staggered manner without overlapping at all is to increase the shielding efficiency of the electromagnetic wave shielding material and to improve the strength of the electromagnetic wave shielding material.

The fourth step, as a step of finalizing the method of manufacturing the electromagnetic wave shielding material using the perforated metal thin plate, is configured to mold the electromagnetic wave shielding material 100 by curing and demolding after forming a third composite material 60 on the second metal layer 50 formed in the third step by impregnating and defoaming again thirdly the reinforced fibers by the thermosetting resin. The reinforced fiber or thermosetting resin used herein may be the same as that used in the second step, and the process of impregnation and defoaming may be performed in the same way as in the second step. Further, it is preferable that the curing is performed at a temperature of −10° C. to 70° C. When the temperature is less than −10° C., the curing is not performed well in the mold, thereby causing the curing time to become too long. When the temperature is more than 70° C., the curing of the thermosetting resin is too fast, thereby deteriorating the workability of defoaming.

In this way, by continuously performing the processes of the first through fourth steps, the electromagnetic wave shielding material is integrated into a single body by chemical bonding between the respective constituent layers, thereby making it possible to produce a product having lightweight and excellent mechanical properties such as strength.

On the other hand, the electromagnetic wave shielding material using the perforated metal thin plate may be manufactured by the above-mentioned manufacturing method, the electromagnetic wave shielding material including: 1) the gel coat layer formed by applying a gel coat to a mold; 2) the first composite layer formed on the gel coat layer by impregnating and defoaming firstly the reinforced fiber by the thermosetting resin; 3) the first metal layer formed on the first composite layer by arranging the perforated metal thin plate; 4) the second composite layer formed on the first metal layer by impregnating and defoaming secondly the reinforced fiber by the thermosetting resin; 5) the second metal layer formed on the second composite layer by arranging the perforated metal thin plate in such a manner that positions of perforations of the second metal layer and the first metal layer are arranged in a staggered manner without overlapping; 6) the third composite layer formed on the second metal layer by impregnating and defoaming thirdly the reinforced fiber by the thermosetting resin.

Hereinafter, the present invention will be described in more detail with reference to examples and drawings.

Embodiment

The electromagnetic wave shielding material according to the present invention was possible to manufacture according to the following process.

1) A mold was coated with liquid gel coat resin (AC-200 manufactured by Insung Industry Co., Ltd.) mixed with the curing agent (MEKPO) to a thickness of 0.4 mm. Then the coating was cured to a degree that fingerprints were visible when a coating surface was pressed by hand, whereby a gel coat layer was formed.

2) A first metal layer was formed by arranging a perforated aluminum thin plate on a first composite layer after forming the first composite layer on the gel coat layer by impregnating and defoaming firstly a 1-ply and 450 g/m$^2$ glass chopped mat as a reinforced fiber by an impregnating roller of unsaturated polyester resin (APS AP1700) mixed with the curing agent (MEKPO).

3) A second metal layer was formed on a second composite material layer by arranging a perforated aluminum thin plate in such a manner that positions of perforations of the perforated aluminum thin plate and the perforated aluminum thin plate of the first metal layer were arranged in a staggered manner without overlapping, after forming the second composite material layer by repeating the process of impregnation and defoaming of step 2).

4) After forming a third composite layer on the second metal layer by repeating the process of impregnation and defoaming of step 2), the surface hardness of the mold was measured by a Barcol hardness tester until cured to 35 or more. Then, the molding was demolded and cured again at 30° C. for 8 hours, whereby an electromagnetic wave shielding material having a thickness of 3 mm was manufactured.

Comparison Example 1

An electromagnetic wave shielding material having a thickness of 0.75 mm was manufactured using a steel plate cold commercial (SPCC).

Comparison Example 2

After melting a resin film after laminating the resin film, metal fiber yarn, aluminum thin film, metal fiber yarn, and resin film in order, the molten resin was cured by being pressed with a punch of a press die and then molded to produce an electromagnetic wave shielding material having a thickness of 3.0 mm using an aluminum thin film.

Experiment Example 1 Shielding Ratio of an Electromagnetic Wave by Frequency

The electromagnetic wave shielding materials manufactured in an embodiment and comparison examples 1 and 2 were each made into a standard specimen (29.7 cm×21.0 cm), and the shielding ratio was measured according to IEEE Std-299, which is the most commonly used standard measurement method. Table 1 shows the results.

TABLE 1

Shielding ratio by frequency

| | Unit | 600 kHz | 700 kHz | 900 kHz | 1100 kHz | 1300 kHz | 1400 kHz |
|---|---|---|---|---|---|---|---|
| Embodiment | dB | 27.2 | 28.6 | 30.2 | 30.7 | 31.6 | 32.5 |
| Comparison example 1 | dB | 27.7 | 28.2 | 29.4 | 30.6 | 31.2 | 31.9 |
| Comparison example 2 | dB | 25.4 | 26.6 | 27.1 | 28.5 | 28.7 | 29.0 |

Experiment Example 2 Mechanical Properties

For the electromagnetic wave shielding materials manufactured in an embodiment and a comparison example 2, mechanical properties such as flexural strength and the like were measured KSM 3015 (general test method for thermosetting plastics), Barcol hardness and weight thereof were also measured, and these results are shown in Table 2.

TABLE 2

Mechanical properties

| | Unit | Embodiment | Comparison example 1 | Comparison example 2 | Remark |
|---|---|---|---|---|---|
| Flexural strength | MPa | 142.2 | — | 98.3 | Glass fiber content of the shielding material: 40 w % Barcol hardness: measured by Barcol hardness tester GYZJ 934-1 |
| Flexural modulus | GPa | 3.6 | — | 2.8 | |
| Tensile strength | MPa | 82.4 | — | 60.1 | |
| Tensile modulus | GPa | 3.2 | — | 2.3 | |
| Barcol hardness | — | 41.0 | — | 29.1 | |
| Weight | g/m² | 4,008 | 6,096 | 3,665 | |

Analysis of Experiment Results

From the experimental results of the embodiment and comparison examples 1 and 2, compared with the electromagnetic wave shielding material according to the comparison examples, the electromagnetic wave shielding material according to the preferred embodiment of the present invention was identified as having advantages of not only superior mechanical properties such as lightweight and flexural strength, but also outstanding shielding ratio. In particular, the electromagnetic wave shielding material according to the embodiment was identified as having a higher shielding ratio in the frequency band of 700-1400 kHz and much lighter weight than the shielding material manufactured by using the SPCC according to the comparison example 1.

While the present invention has been particularly described with reference to exemplary embodiments shown in the drawings, it will be understood by those of ordinary skill in the art that the exemplary embodiments have been described for illustrative purposes, and various changes and modifications may be made without departing from the spirit and scope of the present invention as defined by the appended claims. Accordingly, it should be apparent that the true scope of the present invention is defined by the following claims.

The invention claimed is:

1. A method of manufacturing an electromagnetic wave shielding material using a perforated metal thin plate, the method comprising:
   1) a first step of forming a gel coat to a mold;
   2) a second step of forming a first metal layer on a first composite layer by arranging a perforated metal thin plate, after forming the first composite layer on the gel coat layer formed in the first step by impregnating and defoaming firstly a reinforced fiber by the thermosetting resin;
   3) a third step of forming a second metal layer by arranging a perforated metal thin plate and the first metal layer formed in the second step in such a way that positions of perforations are arranged in a staggered manner without overlapping, after forming a second composite layer on the first metal layer formed in the second step by impregnating and defoaming secondly a reinforced fiber by the thermosetting resin; and
   4) a fourth step of molding the electromagnetic wave shielding material by curing and demolding after forming a third composite material on the second metal layer formed in the third step by impregnating and defoaming again thirdly the reinforced fibers by the thermosetting resin, wherein the electromagnetic wave shielding material molded by continuously performing the processes of the first through fourth steps is integrated into a single body by chemical bonding between respective constituent layers.

2. The method of claim 1, wherein a thickness of the gel coat layer formed in the first step is 0.3-0.5 mm.

3. The method of claim 2, wherein the reinforced fiber in the second step, the third step, and the fourth step is any one selected among a chopped mat, yarn cloth, roving cloth, a continuous mat, and nonwoven fabrics made of glass fiber, carbon fiber, or basalt fiber.

4. The method of claim 3, wherein the thermosetting resin in the second step, the third step, and the fourth step is any one selected among unsaturated polyester resin, vinyl ester resin, epoxy resin, and phenol resin.

5. The method of claim 4, wherein the perforated metal thin plate in the second step or the third step is made of aluminum or copper and has a thickness of 0.01-0.5 mm.

6. The method of claim 5, wherein the curing in the fourth step is performed at a temperature of −10° C. to 70° C.

7. An electromagnetic wave shielding material using a perforated metal thin plate, the electromagnetic wave shielding material is manufactured by claim 1.

* * * * *